US006728814B2

(12) United States Patent
Leinen

(10) Patent No.: US 6,728,814 B2
(45) Date of Patent: *Apr. 27, 2004

(54) RECONFIGURABLE IEEE 1149.1 BUS INTERFACE

(75) Inventor: Wade R. Leinen, Inglewood, CA (US)

(73) Assignee: Raytheon Company, Waltham, MA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/501,477

(22) Filed: Feb. 9, 2000

(65) Prior Publication Data

US 2003/0115396 A1 Jun. 19, 2003

(51) Int. Cl.[7] .......................... G06F 13/14; G06F 3/00; G06F 13/00; G01R 31/28
(52) U.S. Cl. .................. 710/305; 710/14; 710/316; 714/726; 714/727; 714/728; 714/729; 714/742
(58) Field of Search .................. 710/14, 316, 305; 714/30–31, 726–729, 742

(56) References Cited

U.S. PATENT DOCUMENTS

| | | | | |
|---|---|---|---|---|
| 5,111,423 A | * | 5/1992 | Kopec, Jr. et al. | 395/500 |
| 5,471,481 A | * | 11/1995 | Okumoto et al. | 371/22.3 |
| 5,604,432 A | * | 2/1997 | Moore et al. | 324/158.1 |
| 6,006,343 A | * | 12/1999 | Whetsel | 714/28 |
| 6,044,481 A | * | 3/2000 | Kornachuk et al. | 714/724 |
| 6,255,845 B1 | * | 7/2001 | Wong et al. | 326/38 |
| 6,335,955 B1 | * | 1/2002 | Knotts | 375/354 |

* cited by examiner

*Primary Examiner*—Glenn A. Auve
*Assistant Examiner*—Trisha Vu
(74) *Attorney, Agent, or Firm*—Leonard A. Alkov; Glenn H. Lenzen, Jr.

(57) ABSTRACT

A programmable interface. The inventive interface is designed to be used with an interface controller and includes a first circuit for selecting one or more components from a plurality of components in response to at least one first control signal. A second circuit selectively connects the components in response to at least one second control signal. A third circuit selects a serial output mode or a parallel output mode of said components in response to at least one third control signal. In an illustrative implementation, the inventive interface is used as part of an IEEE 1149.1 bus architecture and includes a plurality of stages. At least one of the stages is associated with each of the components under test and includes circuitry for selecting an associated component. The second circuit includes circuitry within each stage for selectively connecting an associated component to a second component by outputting the output of an associated component or the output a previous stage as the output of the stage. The third circuit includes circuitry disposed within each stage for selecting between a serial or parallel mode of operation by outputting the output of a previous stage or a test data output from a bus controller as the test data output from the stage. The first, second and third control signals are provided by the interface controller. The inventive interface thereby provides a system and technique for conducting tests of components in an 1149.1 environment on a single ring so that standard COTS test generation tools can be used, while also allowing run-based commands to be executing on some components while at the same time communicating with other components.

43 Claims, 5 Drawing Sheets

RECONFIGURABLE IEEE 1149.1 BUS INTERFACE

This invention was made with Government support under Contract No. F33657-91-C-0006 awarded by the Department of the Air Force. Accordingly, the U.S. Government may have certain rights in this invention.

BACKGROUND OF THE INVENTION

1. Field of the Invention

The present invention relates to digital systems. More specifically, the present invention relates to systems and methods for testing embedded hardware.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

2. Description of the Related Art

Those skilled in the art appreciate the need to test digital components and systems. Accordingly, today, many digital components and systems such as microprocessors, memory, application specific integrated circuits (ASICs) are equipped with test access ports to facilitate such testing via a test bus. The IEEE 1149.1 bus has become the industry standard test access interface for electronic components. The bus is arranged in a ring configuration where an output signal (TDO—Test Data Out) from one component is connected to an input signal (TDI—Test Data In) of another component. Each component may then be accessed individually by shifting instructions and data through registers located in each component under test. Any number of components can be chained together in this fashion. The ends of the ring are terminated at a bus controller during test. The controller drives the TDI signal on the first component in the ring and samples the data coming out of the TDO signal of the last component in the ring.

The 1149.1 test bus significantly enhances the ability of the system engineer to test individual components of the system quickly and easily. Unfortunately, the conventional 1149.1 test bus does not allow the bus controller to communicate with any components without disturbing another component on the ring that is currently under test. That is, if for example, a test is being run on a component, then other components connected to the 1149.1 ring may not be accessed as this would disturb the test running on the first component.

For certain applications, this represents a limitation that significantly increases the time required to fully validate a system under test. Take for example the startup tests for a unit in an aircraft that is composed of several modules (circuit cards) that are installed into a backplane for interconnecting their signals. Each module will have its own bus controller. These startup tests are broken into two distinct phases: 1) each module in the unit runs a self-test, and 2) all the modules cooperate to perform an interconnect test of the backplane which connects the modules together. Typically there is a strict timing requirement levied on these startup tests.

Unfortunately, some components on the modules require a large amount of time in order to attain the required "fault coverage" (i.e., the probability of detecting a fault). This could increase the module's self-test time such that there would not be enough time left to perform the backplane interconnect test. Thus, there is a need to separate the components that have long self-test times from those that are used to perform the backplane interconnect test so they can be run in parallel. Hence, designers are currently forced to position components having long test times on one 1149.1 bus ring and components used in the backplane interconnect test on another. Those that do not fall into either category can be placed on either ring. However, this multi-ring approach does not lend itself to the use of commercial off-the-shelf (COTS) software test generation tools as these tools require the components being tested to be on a single ring.

Accordingly, a need exists in the art for a system or technique that allows the components to be on a single ring for tests generated by COTS tools, but also allows a separation of components onto separate rings in order to allow parallelism as described in the above example.

SUMMARY OF THE INVENTION

The need in the art is addressed by the programmable interface of the present invention. The inventive interface is designed to be used with an 1149.1 bus controller and includes a first circuit for selecting one or more components from a plurality of components in response to at least one first control signal. A second circuit selectively connects the components in response to at least one second control signal. A third circuit selects a serial output mode or a parallel output mode of said components in response to at least one third control signal.

In an illustrative implementation, the inventive interface is used as part of an IEEE 1149.1 bus architecture and includes a plurality of identical stages, each one cascading into the next. Each stage is associated with a ring of zero or more components, preferably only one, and includes circuitry for selecting the associated component(s). The second circuit includes circuitry within each stage for selectively connecting the associated component(s) to a second component ring associated with another stage. The third circuit includes circuitry disposed within each stage for outputting the output of the associated component ring or the output of another component ring as the output of the stage. The first, second and third control signals are provided by the interface controller.

The inventive interface thereby provides a system and technique for conducting tests of components in an 1149.1 environment on a single ring so that standard COTS test generation tools can be used, and allowing communication with some components while run-based commands are being executed on other components so that parallel activities can be performed.

DESCRIPTION OF THE INVENTION

Illustrative embodiments and exemplary applications will now be described with reference to the accompanying drawings to disclose the advantageous teachings of the present invention.

Figure 1:
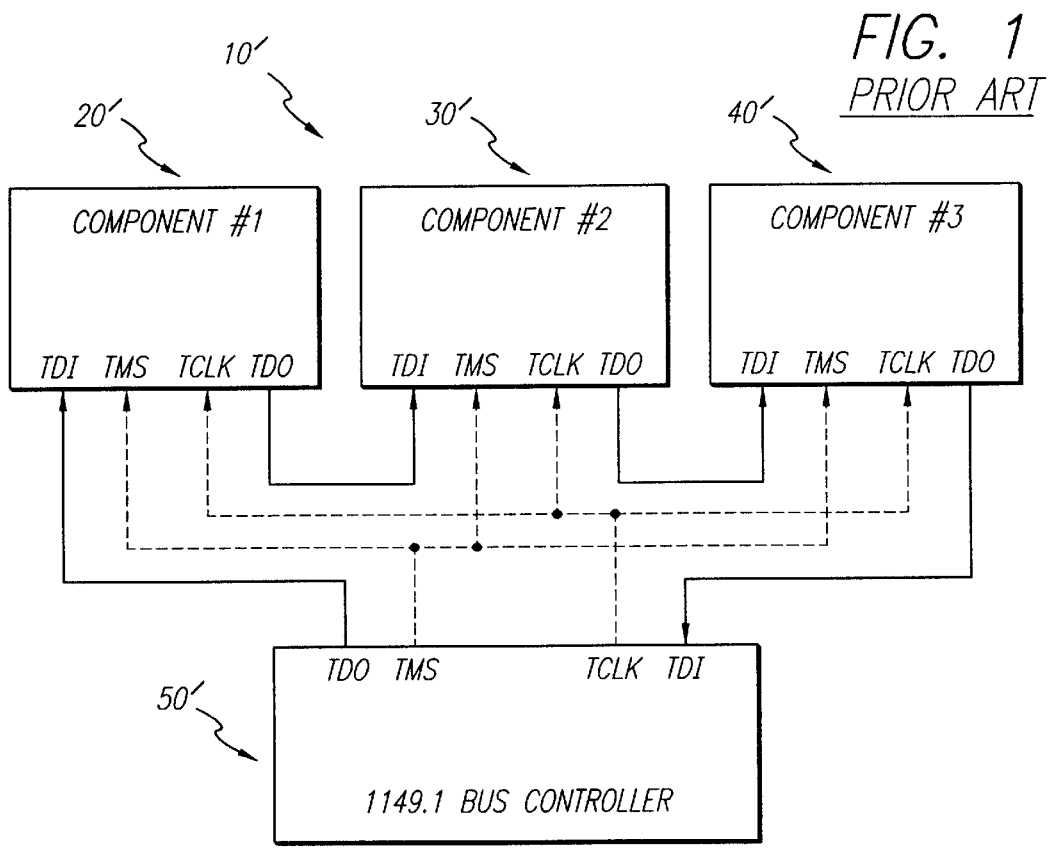
FIG. 1 is a block diagram of a typical serial connection in accordance with a standard IEEE 1149.1 bus configuration.

FIG. 1 is a block diagram of a typical serial connection in accordance with a standard IEEE 1149.1 bus configuration. As mentioned above, system 10' is arranged in a ring configuration where an output signal (TDO—Test Data Out) from one component 20' is connected to an input signal (TDI—Test Data In) of another component 30'. Each component 20', 30', and 40' may then be accessed individually by shifting instructions through registers located in each component under test. Any number of components can be chained together in this fashion. This typical configuration of an 1149.1 is referred to as "serial" access herein. The ends of the ring are terminated at a controller 50' during test. The controller 50' drives the TDI signal on the first component 20' in the ring and samples the data coming out of the TDO signal of the last component 40' in the ring. TMS is a control signal used to control the Test Access Ports (TAPs) of the components while communicating with them. The final signal TCLK is a clock signal. Note that the TMS and TCLK signals are common, so all TAPs should be in the same state at the same time. To get one TAP to perform a test and not the others, unique instructions are shifted in to the target component while benign instructions are shifted to the others. Note that the instructions are shifted through the components on the ring serially, one after another. When all the instructions are in place, the TMS signal is used to invoke the test. The components with the benign instructions will not run any tests.

As mentioned above, although the 1149.1 test bus significantly enhances the ability of the system engineer to test individual components of the system quickly and easily. Unfortunately, the conventional 1149.1 test bus does not allow the system engineer to test any components on the ring if another component is currently running a test. That is, if for example, a test is being run on a first component, then other components connected to the bus may not be accessed as this would disturb the test running on the first component. For certain applications, this represents a limitation that significantly increases the time required to fully validate a system under test. Take for example the startup tests for a unit in an aircraft that is composed of several modules (circuit cards) that are installed into a backplane for interconnecting their signals. Each module will have its own bus controller. These startup tests are broken into two distinct phases: 1) each module in the unit runs a self-test, and 2) all the modules cooperate to perform an interconnect test of the backplane which connects the modules together. Typically there is a strict timing requirement levied on these startup tests.

Unfortunately, some components on the modules require a large amount of time in order to attain the required "fault coverage" (i.e., the probability of detecting a fault). This could increase the module's self-test time such that there would not be enough time left to perform the backplane interconnect test. Thus, there is a need to separate the components that have long self-test times from those that are used to perform the backplane interconnect test so they can be run in parallel. Hence, designers are currently forced to position components having long test times on one 1149.1 bus ring and components used in the backplane interconnect test on another. Those that do not fall into either category can be placed on either ring. However, this multi-ring approach does not lend itself to the use of commercial off-the-shelf (COTS) software test generation tools as these tools require the components being tested to be on a single ring.

Accordingly, a need exists in the art for a system or technique that allows the components to be on a single ring for tests generated by COTS tools, but also allows a separation of components onto separate rings in order to allow parallelism as described in the above example. The present invention addresses the need in the art by providing a programmable interface as discussed more fully below.

Figure 2:
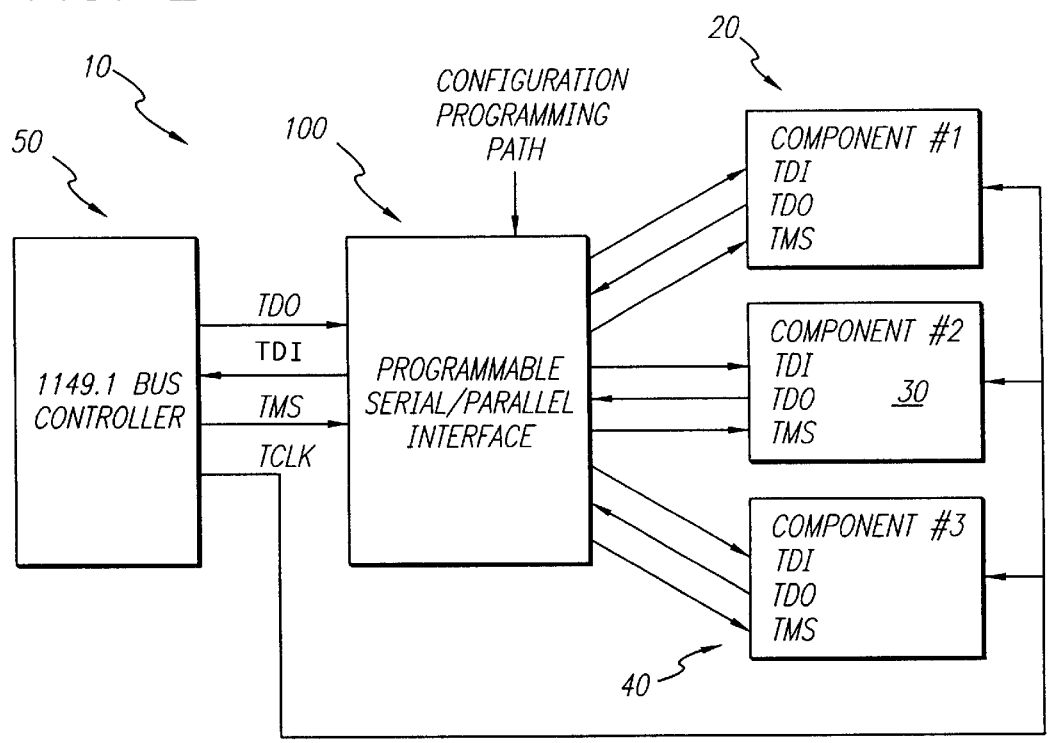
FIG. 2 is a block diagram of a test architecture constructed in accordance with the teachings of the present invention.

FIG. 2 is a block diagram of a test architecture constructed in accordance with the teachings of the present invention. As shown in FIG. 2, a programmable serial/parallel interface 100 is interposed between components 20, 30 and 40 under test and a bus controller 50.

Figure 3:
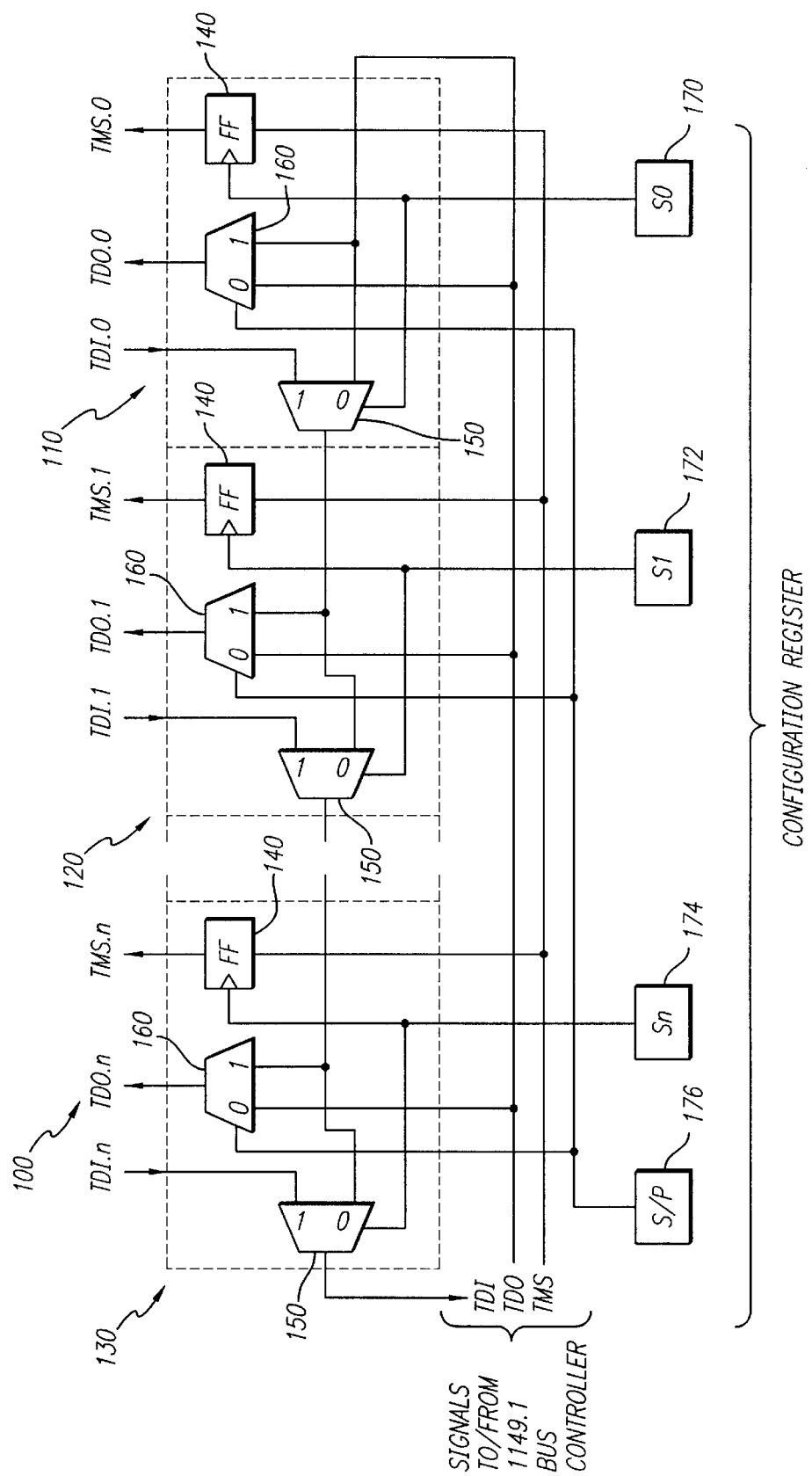
FIG. 3 is a schematic diagram of an illustrative implementation of the interface of FIG. 2.

FIG. 3 is a schematic diagram of an illustrative implementation of the interface 100 of FIG. 2. As shown in FIG. 3, the interface 100 includes a plurality of stages of which first, second and nth stages 110, 120 and 130, respectively, connect to associated components 20, 30 and 40 of FIG. 2, respectively. The TDO output of each stage is connected to the TDI input of its associated component. The TDI input of each stage is connected to the TDO output of its associated component. The TMS output of each stage is connected to the TMS input of its associated component. Each stage contains a latch 140 marked as a flip-flop (HF) on the diagrams, a first multiplexer 150 and a second multiplexer 160, which allows the 1149.1 bus to be reconfigured. As discussed more fully below, the latches 140 for each stage either allow the TMS signal from the bus controller 50 to flow to an associated component or a latched value is driven from the individuals latches 140 under control of select bits 170, 172 or 174. This is depicted in FIG. 4.

Figure 4:
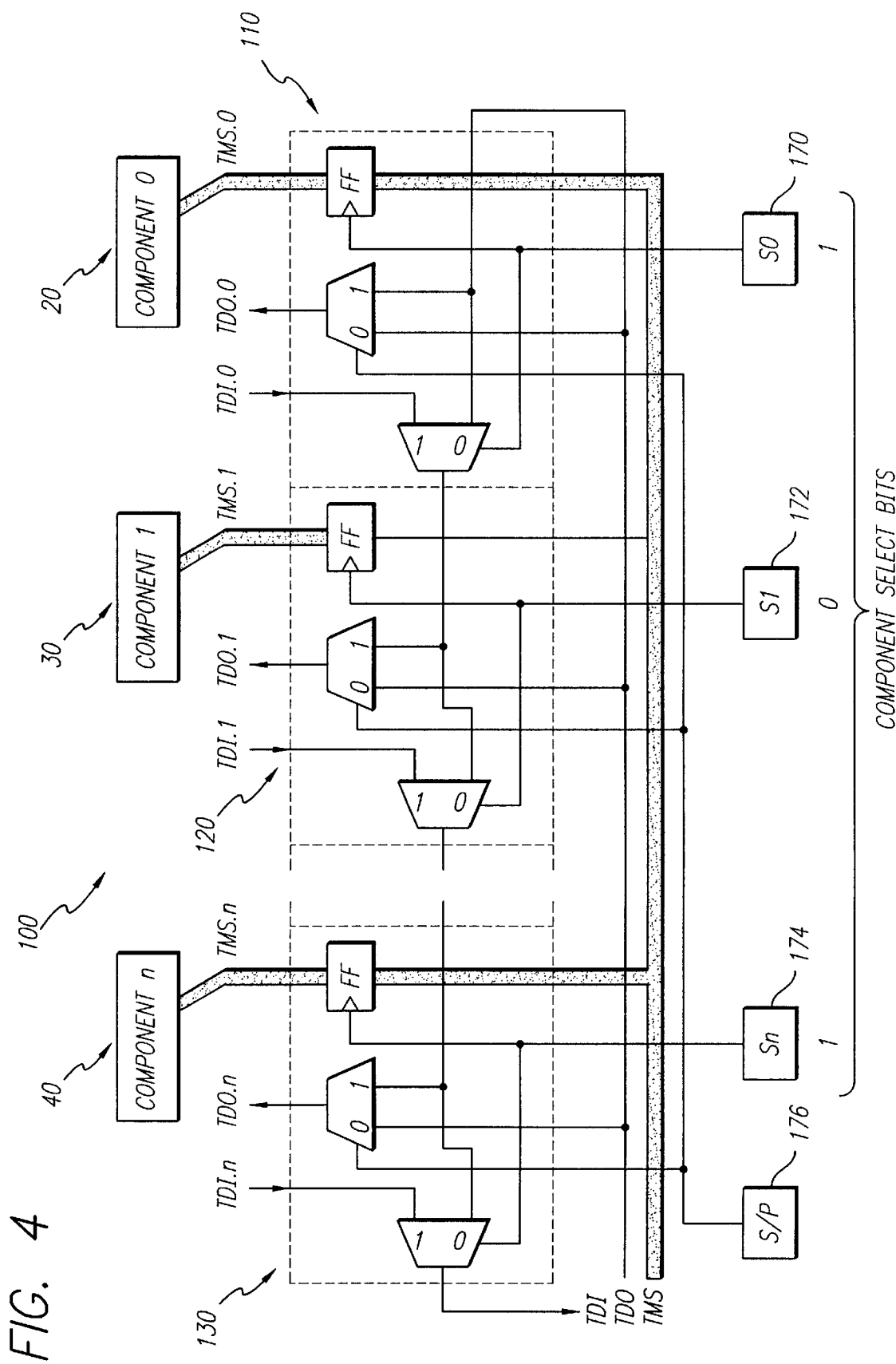
FIG. 4 is a schematic diagram of the illustrative implementation of the interface of FIG. 2 which serves to illustrate component selection in accordance with the present teachings.

FIG. 4 is a schematic diagram of the illustrative implementation of the interface 100 of FIG. 2 which serves to illustrate component selection in accordance with the present teachings. As shown in FIG. 4, when, in the illustrative implementation, the component select bit is high (1), the TMS signal is passed to the associated components 20 and 40 and these components use the TMS signal directly as it passes through their latches. The component 30 uses the latched value of the TMS signal stored in its latch since its component select bit is low (0).

Returning to FIG. 3, the control bits 170, 172, 174 and 176 together will be referred to as the control register herein. This register can be loaded by the user even though a circuit path for this is not shown on the diagrams of FIG. 3 through FIG. 6. The block diagram of FIG. 2 shows this as the configuration programming path. The value of the configuration register should not be modified while a communication operation is in progress.

The select bits 170, 172 and 174 also control the first multiplexer 150 of each stage 110, 120 or 130 to select between two possible outputs to an adjacent stage. The first being the cascaded output from the previous stage, or in the case of the first stage 110, the TDO signal from the bus controller 50. The second being the TDO output signal from an associated component 20, 30 or 40 (not shown) which is connected to the stage's TDI input.

The second multiplexer 160 of each stage selects between the TDO signal from the bus controller 50 and the output of the preceding stage (or the TDO signal from the bus controller 50 in the case of the first stage 110) for output to an associated component as a TDO signal in response to a control signal from a fourth control bit 176. In effect, the control register selects a 'serial' or 'parallel' mode of operation for the system 10 as depicted in FIGS. 5 and 6.

Figure 5:
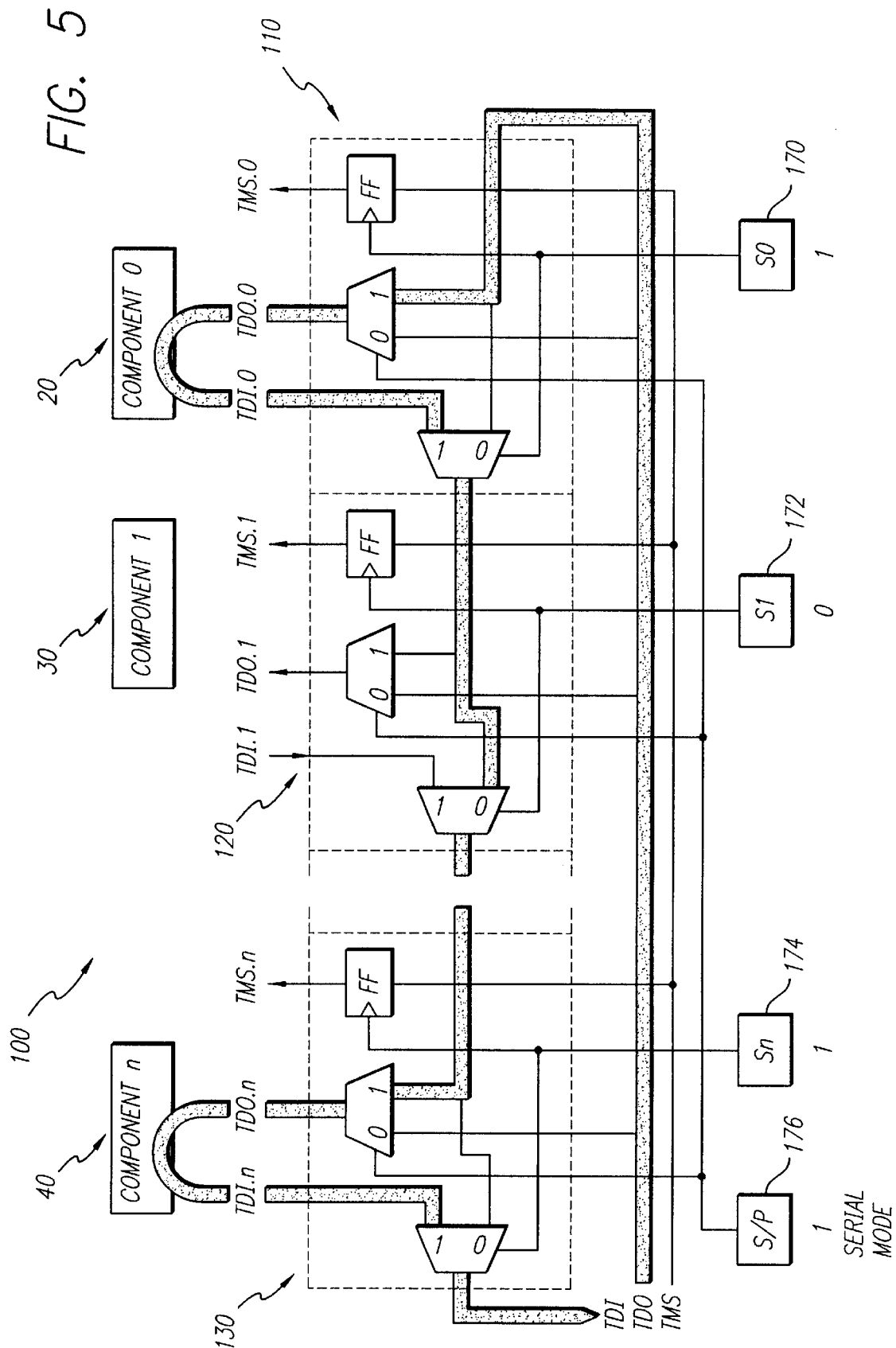
FIG. 5 is a schematic diagram of the illustrative implementation of the interface of FIG. 2 which serves to illustrate a 'serial' connection mode in accordance with the present teachings.

FIG. 5 is a schematic diagram of the illustrative implementation of the interface 100 of FIG. 2 which serves to illustrate a 'serial' connection mode in accordance with the present teachings. As shown in FIG. 5, when, in the illustrative implementation, the S/P mode bit is high (1), each stage is 'daisy chained' to adjacent stages. Hence, if a stage is 'selected' via a select bit register, then the associated component is selected and daisy chained with other selected components. Those components that are not selected, e.g. 30, will not receive input data and will not be allowed to provide output data. The first multiplexer of each stage outputs either the TDO signal (i.e., the stage's TDI input) from the associated component or the output of the preceding stage depending on the status of the component select bit as discussed above.

Figure 6:
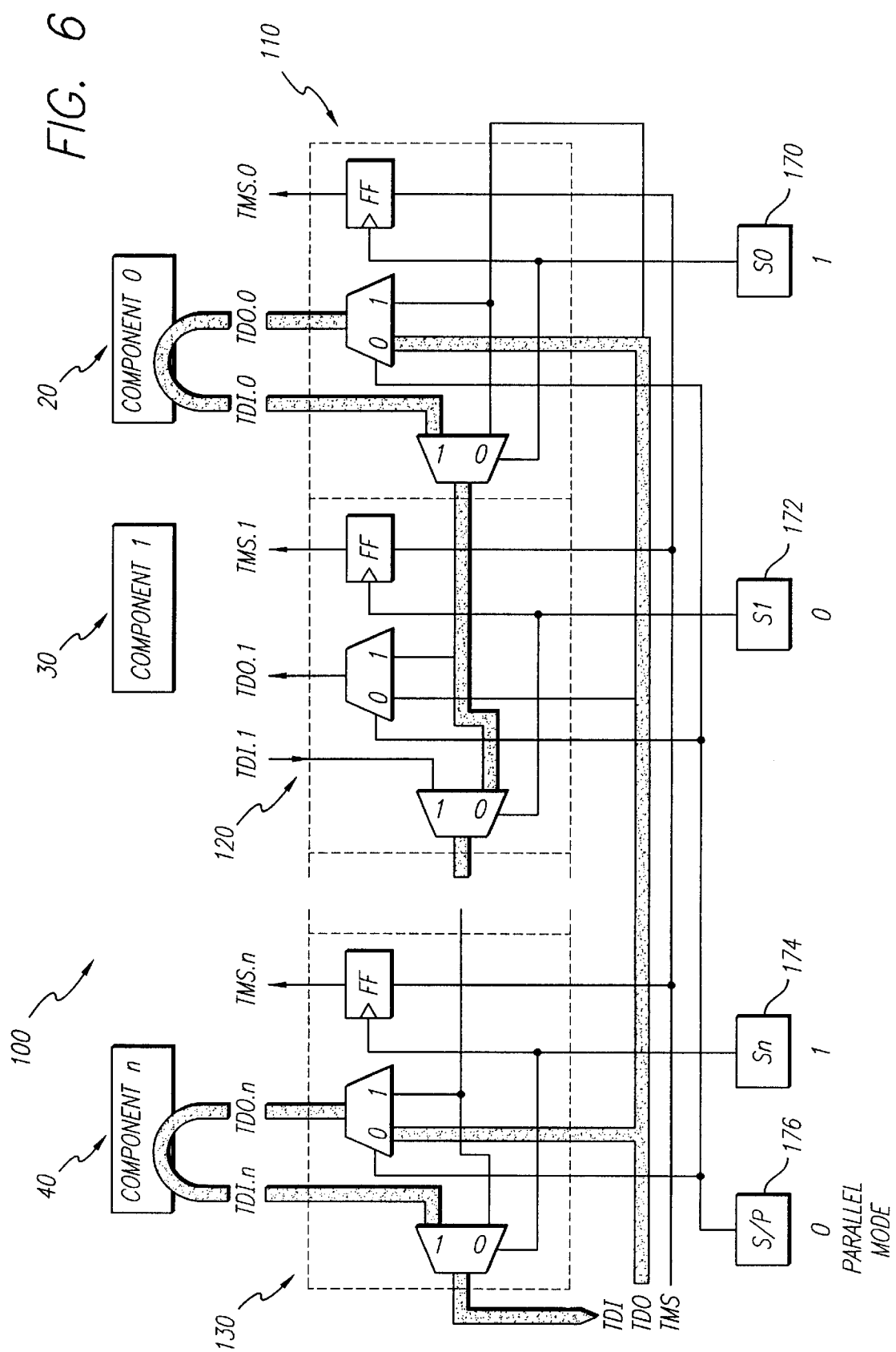
FIG. 6 is a schematic diagram of the illustrative implementation of the interface of FIG. 2 which serves to illustrate a 'parallel' connection mode in accordance with the present teachings.

FIG. 6 is a schematic diagram of the illustrative implementation of the interface 100 of FIG. 2 which serves to illustrate a 'parallel' connection mode in accordance with the present teachings. When the S/P bit is low (0), the second multiplexer selects the TDO signal provided by the bus controller 50 (not shown) and outputs it to the associated component. Once again, the first multiplexer of each stage outputs either the TDO signal (i.e., the stage's TDI input) from the associated component or the output of the preceding stage depending on the status of the component select bit as discussed above.

Those skilled in the art will appreciate that with the simple addition of a third multiplexer in each stage and a control mechanism for same, the system may be made to be bidirectional. Additional multiplexing with associated control mechanisms could make a system that allows the components to be placed in any order on the ring.

In addition, those skilled in the art will recognize that a system as described in the illustrative example containing many stages might introduce excessive propagation delays if too many consecutive stages are unselected. Commonly used solutions such as look-ahead methods or the introduction of a shift register bit between each stage would alleviate the concern.

The inventive interface thereby provides a flexible system and technique for conducting tests of components in an 1149.1 environment on a single ring so that standard COTS test generation tools can be used, while also allowing run-based commands to be executing on some components while at the same time communicating with other components.

Thus, the present invention has been described herein with reference to a particular embodiment for a particular application. Those having ordinary skill in the art and access to the present teachings will recognize additional modifications applications and embodiments within the scope thereof.

It is therefore intended by the appended claims to cover any and all such applications, modifications and embodiments within the scope of the present invention.

Accordingly,

What is claimed is:

1. A programmable interface comprising:
    first means for selecting one or more components from a plurality of components in response to at least one first control signal;
    second means for selectively connecting said components in response to at least one second control signal;
    wherein said interface includes a plurality of stages, at least one of said stages is associated with each of said components;
    wherein said first means includes means disposed within each stage for selecting an associated component and wherein said means disposed within each stage for selecting an associated component is a flow-through latch;
    wherein said second means includes means disposed within each stage for selectively connecting an associated component to a second component and wherein said means disposed within each stage for selectively connecting an associated component to a second component is a first multiplexer; and
    wherein said third means includes means disposed within each stage for connecting the test data input of the associated component to the test data output of another selected component or the test data output of a bus controller, wherein said means disposed within each stage for connecting the test data input of the associated component to the test data output of another selected component of the test data output of a bus controller is a second multiplexer; and
    third means for selecting a serial output mode or a parallel output mode of said components in response to at least one third control signal.

2. The invention of claim 1 wherein said first signal controls said latch and said second multiplexer.

3. The invention of claim 2 wherein said latch selectively outputs an input test mode select signal as an output test mode select signal for a host stage to an associated component in response to said first signal.

4. The invention of claim 3 wherein said first signal is a component select signal.

5. The invention of claim 2 wherein said second signal controls said first multiplexer.

6. A The invention of claim 5 wherein said second signal is a serial/parallel control signal.

7. The invention of claim 5 wherein said first multiplexer selects between the output of a preceding stage and a test data out signal from an associated component as the output signal of a host stage.

8. The invention of claim 7 wherein said second multiplexer selects between an output by a preceding stage and a test data output signal from a bus controller as a test data output signal to an associated component to be used as its test data input signal.

9. The invention of claim wherein said first signal is said second signal.

10. The invention of claim 1 wherein said second means includes means disposed within each stage for selectively connecting an associated component to a second component.

11. The invention of claim 1 wherein said third means includes means disposed within each stage for outputting the output of a preceding stage or a test data output signal from a bus controller as a test data output signal to an associated component to be used as its test data input signal.

12. The invention of claim 1 wherein said first means includes a flow-through latch.

13. The invention of claim 12 wherein said second means includes a first multiplexer.

14. The invention of claim 13 wherein said third means includes a second multiplexer.

15. The invention of claim 1 further including means for providing said first, said second and said third control signals.

16. A programmable IEEE 1149.1 bus architecture for outputting data to and receiving data from a plurality of components, said architecture comprising:
   an interface, said interface including a plurality of stages, at least one of said stages being associated with one of said components, each stage including:
      circuitry for selecting one or more components from a plurality of components in response to at least one first control signal, said circuitry for selecting one or more components from a plurality of components including means disposed within each stage for selecting an associated component wherein said means disposed within each stage for selecting an associated component is a flow-through latch,
      circuitry for selectively connecting said components in response to said first control signal said circuitry for selectively connecting said components includes means disposed within each stage for selectively providing the output of an associated component to a second component and wherein said means disposed within each stage for selectively providing the output of an associated component to a second component is a first multiplexer, and
      circuitry for selecting a serial output mode or a parallel output mode of said components in response to at least one second control signal, wherein said circuitry for selecting a serial output mode or a parallel output mode of said components includes means disposed within each stage for outputting the output of a preceding stage or a test data output signal from a bus controller as a test data output signal to an associated component to be used as its test data input signal, wherein said means disposed within each stage for outputting the output of a preceding stage or a test data output signal from a bus controller as a test data output signal to an associated component to be used as its test data input signal is a second multiplexer: and
   circuitry for providing said first and said second control signals.

17. The invention of claim 16 wherein said first signal controls said latch and said second multiplexer.

18. The invention of claim 17 wherein said latch selectively outputs an input test mode select signal as an output test mode select signal for a host stage to an associated component in response to said first signal.

19. The invention of claim 18 wherein said first signal is a component select signal.

20. The invention of claim 17 wherein said second signal controls said second multiplexer.

21. The invention of claim 20 wherein said second signal is a serial/parallel control signal.

22. The invention of claim 20 wherein said second multiplexer selects between the output of a preceding stage and a test data out signal from a bus controller as the test data output signal of a host stage.

23. The invention of claim 22 wherein said first multiplexer selects between a test data output signal from an associated component and an output signal output by a preceding stage as an output signal of a host stage.

24. A programmable interface comprising:
   first means for selecting one or more components from a plurality of components in response to at lest one first control signal, wherein said first means includes a flow-through latch;
   second means for selectively connecting said components in response to at least one second control signal, wherein said second means includes a first multiplexer; and
   third means for selecting a serial output mode or a parallel output mode of said components in response to at least one third control signal, wherein said third means includes a second multiplexer.

25. The invention of claim 24 wherein said interface includes a plurality of stages.

26. The invention of claim 25 wherein at least one of said stages is associated with each of said components.

27. The invention of claim 26 wherein said first means includes means disposed within each stage for selecting an associated component.

28. The invention of claim 27 wherein said means disposed within each stage for selecting an associated component is a flow-through latch.

29. The invention of claim 28 wherein said second means includes means disposed within each stage for selectively connecting an associated component to a second component.

30. The invention of claim 29 wherein said means disposed within each stage for selectively connecting an associated component to a second component is a first multiplexer.

31. The invention of claim 30 wherein said third means includes means disposed within each stage for connecting the test data input of the associated component to the test data output of another selected component or the test data output of a bus controller.

32. The invention of claim 31 wherein said means disposed within each stage for connecting the test data input of the associated component to the test data output of an another selected component or the test data output of a bus controller is a second multiplexer.

33. The invention of claim 32 wherein said first signal controls said latch and said second multiplexer.

34. The invention of claim 33 wherein said latch selectively outputs an input test mode select signal as an output test mode select signal for a host stage to an associated component in response to said first signal.

35. The invention of claim 34 wherein said first signal is a component select signal.

36. The invention of claim 33 wherein said second signal controls said first multiplexer.

37. The invention of claim 36 wherein said second signal is a serial/parallel control signal.

38. The invention of claim 36 wherein said first multiplexer selects between the output of a preceding stage and a test data out signal from an associated component as the output signal of a host stage.

39. The invention of claim 38 wherein said second multiplexer selects between an output by a preceding stage and a test data output signal from a bus controller as a test data output signal to an associated component to be used as its test data input singal.

40. The invention of claim 36 wherein said first signal is said second signal.

41. The invention of claim 26 wherein said second means includes means disposed within each stage for selectively connecting an associated component to a second component.

42. The invention of claim 26 wherein said third means includes means disposed within each stage for outputting the output of a preceding stage or a test data output signal from a bus controller as a test data output signal to an associated component to be used as its test data input signal.

43. The invention of claim 24 further including means for providing said first, said second and said third control signals.

* * * * *